United States Patent
Chen et al.

(10) Patent No.: US 6,881,670 B2
(45) Date of Patent: Apr. 19, 2005

(54) INTERCONNECT PROCESS AND METHOD FOR REMOVING METAL SILICIDE

(75) Inventors: Tien-Sung Chen, Taoyuan (TW); Yi-Nan Chen, Taipei (TW); Jin-Tau Huang, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/709,264

(22) Filed: Apr. 26, 2004

(65) Prior Publication Data

US 2005/0054193 A1 Mar. 10, 2005

(30) Foreign Application Priority Data

Sep. 9, 2003 (TW) .................................. 92124837 A

(51) Int. Cl.[7] .............................................. H01L 21/44
(52) U.S. Cl. .................. 438/655; 438/664; 438/671; 438/683; 438/745; 438/755
(58) Field of Search ................ 438/745, 755, 438/654, 655, 664, 671, 683, 751

(56) References Cited

U.S. PATENT DOCUMENTS

| | | | | |
|---|---|---|---|---|
| 4,663,191 A | * | 5/1987 | Choi et al. ................ | 438/682 |
| 5,776,817 A | * | 7/1998 | Liang ........................ | 438/427 |
| 6,110,834 A | * | 8/2000 | Kinoshita et al. ............ | 438/706 |
| 6,228,724 B1 | * | 5/2001 | Gardner et al. ............. | 438/287 |
| 6,228,728 B1 | * | 5/2001 | Furukawa et al. .......... | 438/300 |
| 2004/0115909 A1 | * | 6/2004 | Lee et al. .................... | 438/585 |

* cited by examiner

Primary Examiner—Trung Dang
(74) Attorney, Agent, or Firm—Jiang Chyun IP Office

(57) ABSTRACT

A process for fabricating interconnects is provided. First, a substrate having a dielectric layer and silicon-containing mask layer on the dielectric layer is provided. The dielectric layer is patterned to form an opening. Thereafter, a metallic glue layer is formed over the silicon-containing mask layer and the interior surfaces of the opening. A metallic layer is formed over the substrate to fill the opening and cover the metallic glue layer. A thermal treatment process is next carried out so that the metallic glue layer reacts with the silicon-containing mask layer to form a metal silicide layer. A portion of the metallic layer is removed to expose the metal silicide layer. A solution mixture containing hydrogen peroxide, sulfuric acid, water and hydrofluoric acid is used to remove the metal silicide layer. The silicon-containing mask layer is also removed to expose the dielectric layer. The solution mixture containing hydrogen peroxide, sulfuric acid, water and hydrofluoric acid can remove the metal silicide layer completely without damaging the metallic layer.

18 Claims, 3 Drawing Sheets

INTERCONNECT PROCESS AND METHOD FOR REMOVING METAL SILICIDE

CROSS REFERENCE TO RELATED APPLICATIONS

This application claims the priority benefit of Taiwan application serial no. 92124837, filed Sep. 9, 2003.

BACKGROUND OF INVENTION

1. Field of the Invention

The present invention relates to a semiconductor process. More particularly, the present invention relates to an interconnect process and a method for removing metal silicide.

2. Description of the Related Art

With great advancement in semiconductor fabrication technologies, dimensions of devices continue to shrink. When the level of integration increases, the surface area on a chip becomes insufficient to accommodate all interconnects. To meet the increase demands for interconnects with device miniaturization, a multi-layered design has been developed. In fact, most very large scale integrated (VLSI) circuit chips deployed a multi-layered interconnect design.

In the process of fabricating interconnects with a dimension smaller than 0.11 $\mu$m, a conventional etching operation using a photoresist layer as an etching mask can no longer produce a contact or conductive line with very small dimensions due to photolithographic limitations. Therefore, polysilicon with a high etching selectivity relative to the dielectric layer must be used as an etching mask. Because the metal in a metallic layer may react with silicon in the polysilicon at a high temperature, metal silicide layer is often formed on the surface of the polysilicon layer when polysilicon is used as an etching mask in the interconnect process. To facilitate subsequent fabrication processes, removing the silicide layer is a very important step.

SUMMARY OF INVENTION

Accordingly, at least one object of the present invention is to provide an interconnect process for removing silicide material without damaging the internal metallic structure of interconnects whenever a polysilicon layer is used as an etching mask so that a metal silicide layer is formed over the polysilicon mask.

At least a second object of this invention is to provide an effective method of removing metal silicide layer that differs from the conventional method.

To achieve these and other advantages and in accordance with the purpose of the invention, as embodied and broadly described herein, the invention provides an interconnect process. First, a substrate having a dielectric layer and silicon-containing mask layer on the dielectric layer is provided. Using the silicon-containing mask layer as an etching mask, the dielectric layer is patterned to form an opening. Thereafter, a metallic glue layer is formed over the silicon-containing mask layer and the interior surfaces of the opening. A metallic layer is formed over the substrate to fill the opening and cover the metallic glue layer. A thermal treatment process is next carried out so that the molecules within the metallic glue layer reacts with the material inside the silicon-containing mask layer to form a metal silicide layer. Using the metal silicide layer as a polishing stop layer, a chemical-mechanical polishing operation is performed to remove a portion of the metallic layer until the metal silicide layer is exposed. A cleaning process is performed to remove the metal silicide layer and expose the silicon-containing mask layer. In the cleaning process, a solution mixture containing hydrogen peroxide, sulfuric acid, water and hydrofluoric acid is used. Finally, another chemical-mechanical polishing process is used to remove the silicon-containing mask layer until the dielectric layer is exposed.

This invention also provides a method of removing a metal silicide layer. In this method, a solution mixture containing hydrogen peroxide, sulfuric acid, water and hydrofluoric acid is used to flush the metal silicide layer. The ratio of hydrogen peroxide, sulfuric acid and water in the solution is 1~10:1~10:1~100 and the concentration of hydrofluoric acid in the solution mixture is about 1~20 ppm.

In this invention, a cleaning solution containing hydrogen peroxide, sulfuric acid, water and hydrofluoric acid is used to clear away the metal silicide layer grown over a silicon-containing mask layer in an interconnect process. The cleaning solution is effective for removing metal silicide material but has no adverse effects on the structural organization within the metallic interconnects.

Furthermore, the method of using a solution containing hydrogen peroxide, sulfuric acid, water and hydrofluoric acid as an agent for removing metal silicide material is an untried technique that differs from the conventional method of removing metal silicide layer.

Moreover, using the aforementioned cleaning solution to remove metal silicide material costs less than some other cleaning methods (for example, performing a chemical-mechanical polishing operation).

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
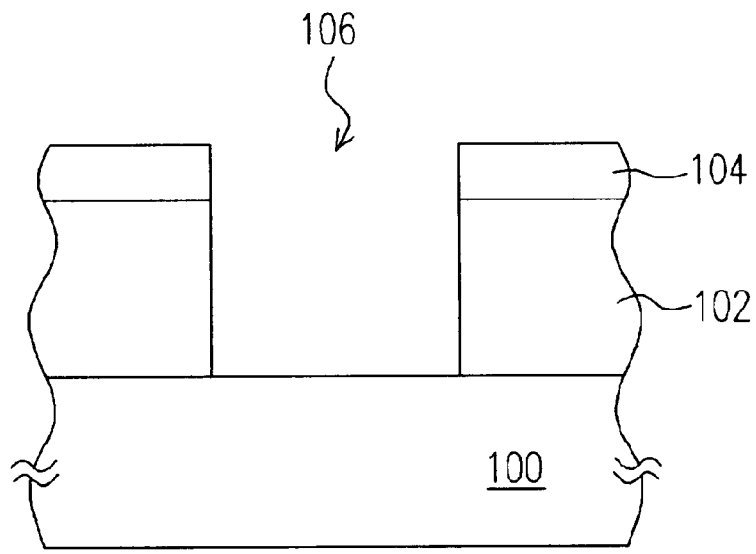
FIGS. 1A through 1F are schematic cross-sectional views showing the steps for forming metallic interconnects according to a preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing the steps for forming metallic interconnects according to a preferred embodiment of this invention. As shown in FIG. 1A, a substrate 100 having a dielectric layer 102 and a silicon-containing mask layer 104 over the dielectric layer 102 is provided. The dielectric layer 102 has an opening 106 therein. The opening 106 is formed using the silicon-containing mask layer 104 as an etching mask. Here, the opening 106 can be a contact opening, a trench or a dual damascene opening, for example.

In one embodiment of this invention, the silicon-containing mask layer 104 is fabricated from polysilicon, for example. Since in the fabrication of contacts or conductive lines with a dimension smaller than 0.11 $\mu$m using a photoresist layer as an etching mask is subjected to photolithography limitations, a polysilicon with a high etching selectivity relative to the dielectric layer must be used as an etching mask.

After forming the opening 106, a cleaning process is performed to remove any residues from the opening 106. In one embodiment, the opening 106 is cleaned using a buffer oxide etchant (BOE) diluted with water in a 400:1 ratio. The cleaning process is carried out for a period of about 60 seconds, for example.

Figure 1B:
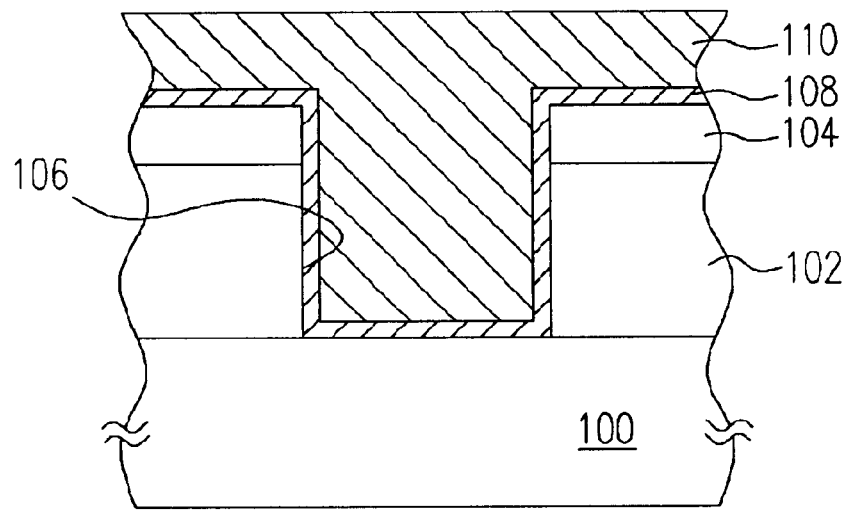

As shown in FIG. 1B, a conformal metallic glue layer 108 is formed over the substrate 100 to cover the silicon-containing mask layer 104 and the interior surface of the opening 106. In one preferred embodiment, the metallic glue layer 108 is a titanium nitride/titanium layer with a thickness between 180 Å to 220 Å, for example. Thereafter, a metallic layer 110 is formed over the substrate 100 to fill the opening 106 completely and cover the metallic glue layer 108. In one preferred embodiment, the metallic layer is a tungsten layer, for example.

Figure 1C:
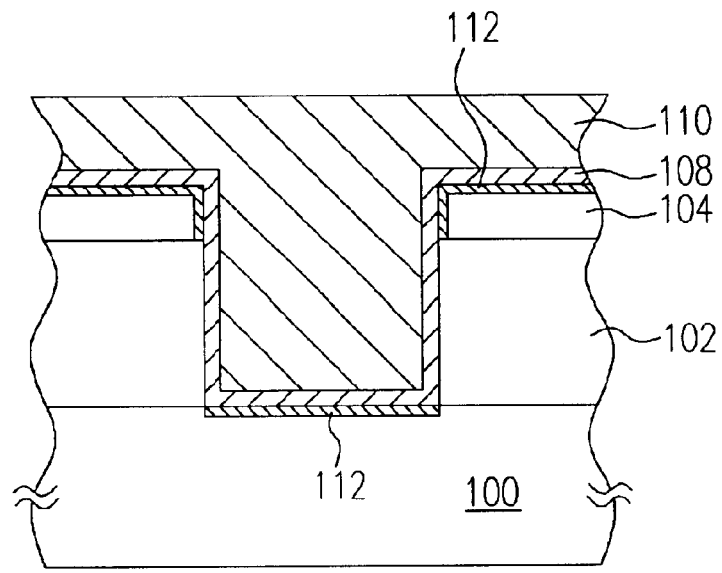

As shown in FIG. 1C, a thermal process is carried out so that the metallic atoms in the metallic glue layer 108 reacts with silicon in the silicon-containing mask layer 104 to form a metal silicide layer 112. Since the substrate 100 is made from silicon, the metallic glue layer 108 at the bottom of the opening 106 may react with the substrate 100 to form a metal silicide layer 112 as well. If the metallic glue layer 108 is fabricated from titanium nitride/titanium, the metal silicide layer 112 after the reaction is a titanium silicide layer. In one preferred embodiment of this invention, the thermal process is a rapid thermal annealing operation with a reaction temperature below 600° C., for example.

Figure 1D:
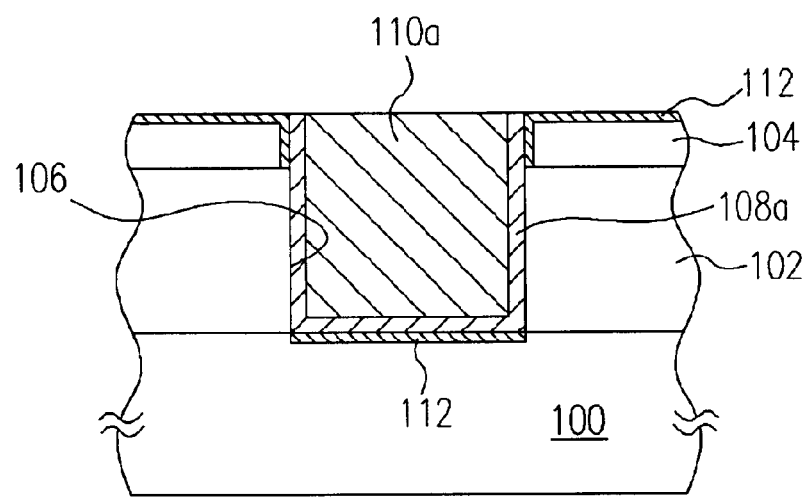

As shown in FIG. 1D, a portion of the metallic layer 110 is removed to form a metallic layer 110a and expose the metal silicide layer 112. In the process, the metallic glue layer 108 above the metal silicide layer 112 is also removed so that a metallic glue layer 108a within the opening 106 remains. In one preferred embodiment, the method of removing a portion of the metallic layer 110 includes performing a chemical-mechanical polishing operation using the metal silicide layer 112 as a polishing stop layer. Since titanium silicide layer 112 is an ideal stopping layer for polishing tungsten, metal silicide layer is often used as a polishing stop layer when polysilicon is used as a mask layer in the fabrication of metallic interconnects.

Figure 1E:
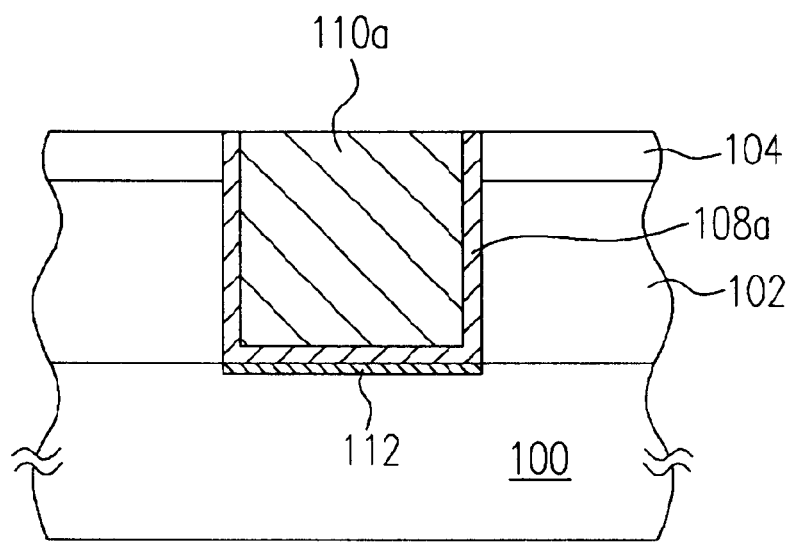

As shown in FIG. 1E, the metal silicide layer 112 is removed so that the silicon containing mask layer 104 is exposed. In one preferred embodiment, the method of removing the metal silicide layer 112 includes flushing with a solution mixture containing hydrogen peroxide, sulfuric acid, water and hydrofluoric acid. The ratio of hydrogen peroxide, sulfuric acid and water in the cleaning solution is 1~10:1~10:1~100 and the concentration of hydrofluoric acid in the solution is about 1~20 ppm, for example. Preferably, the ratio of hydrogen peroxide, sulfuric acid and water in the cleaning solution is 7:3:50 and the concentration of hydrofluoric acid in the cleaning solution is 10 ppm.

Since the metallic silicide layer 112 must be removed before the silicon-containing mask layer 104, the process of removing the metal silicide layer 112 without damaging the metallic layer 110a is very important.

In this invention, the aforementioned cleaning solution is applied to remove the metal silicide layer 112. The cleaning solution is strong enough to remove the metal silicide layer 112 completely but mild enough not to damage the internal structure of the metallic layer 110a. Hence, the solution using the aforementioned ingredients and mixed according to the specified proportion is an ideal cleaning agent.

Figure 1F:
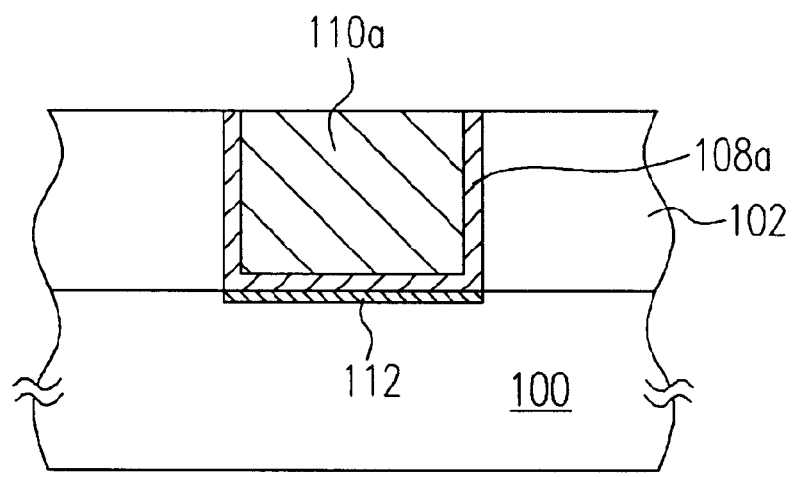

As shown in FIG. 1F, the silicon-containing mask layer 104 is removed so that the dielectric layer 102 is exposed thereby completing the fabrication of metallic interconnects. In one preferred embodiment, the method of removing the silicon-containing mask layer 104 includes performing a chemical-mechanical polishing operation to expose the upper surface of the dielectric layer 102.

In this invention, a cleaning solution containing hydrogen peroxide, sulfuric acid, water and hydrofluoric acid is used to clear away the metal silicide layer grown over a silicon-containing mask layer in an interconnect process. The cleaning solution is effective for removing metal silicide material but has no adverse effects on the structural organization within the metallic interconnects.

Furthermore, the method of using a solution containing hydrogen peroxide, sulfuric acid, water and hydrofluoric acid as an agent for removing metal silicide material is an untried technique that differs from the conventional method of removing metal silicide layer.

In addition, using the aforementioned method to remove the metal silicide material costs less than other conventional methods (for example, performing a chemical-mechanical polishing operation).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process for fabricating metal interconnects, comprising the steps of:

providing a substrate having a dielectric layer and a silicon-containing mask layer over the dielectric layer;

patterning the dielectric layer to form an opening using the silicon-containing mask layer as an etching mask;

forming a metallic glue layer over the silicon-containing mask layer and interior surfaces of the opening;

forming a metallic layer over the substrate to fill the opening and cover the metallic glue layer;

performing a thermal treatment so that the metallic glue layer reacts with the silicon-containing mask layer to form a metal silicide layer;

removing a portion of the metallic layer using the metal silicide layer as an stopping layer so that the metal silicide layer is exposed;

performing a cleaning process to remove the metallic silicide layer; and removing the silicon-containing mask layer so that the dielectric layer is exposed.

2. The process of claim 1, wherein material constituting the silicon-containing mask layer comprises polysilicon.

3. The process of claim 1, wherein the cleaning process is performed using a solution mixture containing hydrogen peroxide, sulfuric acid, water and hydrofluoric acid.

4. The process of claim 3, wherein ratios of hydrogen peroxide, sulfuric acid and water in the solution mixture is 1~10:1~10:1~100.

5. The process of claim 3, wherein a concentration of hydrofluoric acid within the cleaning solution is 1~20 ppm.

6. The process of claim 1, wherein the step of removing the portion of the metallic layer to expose the metal silicide layer comprises performing a chemical-mechanical polishing operation.

7. The process of claim 1, wherein the step of removing the silicon-containing mask layer to expose the dielectric layer comprises performing a chemical-mechanical polishing operation.

8. The process of claim 1, wherein before forming the metallic glue layer, the process further comprises performing a cleaning process to remove residues from the opening.

9. The process of claim 1, wherein the thermal treatment comprises a rapid thermal annealing operation.

10. The process of claim 1, wherein the thermal treatment is carried out at a temperature smaller than 600° C.

11. The process of claim 1, wherein the metallic glue layer comprises a titanium nitride/titanium composite layer.

12. The process of claim 11, wherein the metal silicide layer comprises a titanium silicide layer.

13. The process of claim 11, wherein the titanium nitride/titanium composite layer has a thickness between about 180 Å to 220 Å.

14. The process of claim 1, wherein the metallic layer comprises a tungsten layer.

15. A method for removing a metal silicide layer, comprising the steps of:

removing a metal silicide layer using a solution mixture containing hydrogen peroxide, sulfuric acid, water and hydrofluoric acid, wherein ratios of hydrogen peroxide, sulfuric acid and water within the solution is 1~10:1~10:1~100 and a concentration of the hydrofluoric acid is 1~20 ppm.

16. The method of claim 15, wherein the ratio of hydrogen peroxide, sulfuric acid and water within the solution is 7:3:50.

17. The method of claim 15, wherein the concentration of hydrofluoric acid within the solution is 10 ppm.

18. The method of claim 15, wherein the metal silicide layer comprises a titanium silicide layer.

* * * * *